United States Patent [19]

Lubberts

[11] Patent Number: 5,052,120
[45] Date of Patent: Oct. 1, 1991

[54] SHEET POSITIONING, CLAMPING, AND TENSIONING MEANS

[75] Inventor: Cor Lubberts, Rochester, N.Y.

[73] Assignee: Eastman Kodak Company, Rochester, N.Y.

[21] Appl. No.: 509,647

[22] Filed: Apr. 16, 1990

[51] Int. Cl.5 .................... B41F 27/06; B41F 13/12; G01D 21/00

[52] U.S. Cl. ................................ 33/618; 33/623; 101/415.1; 101/DIG. 36

[58] Field of Search ............... 33/613, 614, 615, 616, 33/617, 618, 619, 620, 621, 623; 101/378, 409, 411, 415, 415.1, DIG. 36; 29/118, 119

[56] References Cited

U.S. PATENT DOCUMENTS

| | | |
|---|---|---|
| 2,085,093 | 6/1937 | Gauthier . |
| 3,160,096 | 12/1964 | Norton ................................ 33/623 |
| 3,368,439 | 2/1968 | Bungal, Jr. ........................ 33/614 |
| 3,626,600 | 12/1971 | Gaither ............................. 33/613 |
| 3,772,991 | 11/1973 | Taguchi et al. .................. 101/415.1 |
| 3,882,775 | 5/1975 | Lytle et al. ...................... 101/415.1 |
| 3,899,972 | 8/1975 | Albright .......................... 101/415.1 |
| 3,913,480 | 10/1975 | Dauner et al. ................... 101/378 |
| 4,183,299 | 1/1980 | Cappel ............................. 101/415.1 |
| 4,259,904 | 4/1981 | Metse .............................. 33/623 |
| 4,357,093 | 11/1982 | Caudill et al. .................. 101/415.1 |
| 4,437,407 | 3/1984 | Wirz et al. ....................... 101/409 |
| 4,459,913 | 7/1984 | Kowalik .......................... 101/415.1 |
| 4,510,868 | 4/1985 | Fischer ............................ 101/415.1 |
| 4,723,134 | 2/1988 | Morita et al. ................... 101/415.1 |
| 4,727,806 | 3/1988 | Green, Sr. ....................... 101/415.1 |
| 4,785,736 | 11/1988 | Jeschke ............................ 101/415.1 |
| 4,840,121 | 6/1989 | Szczesniak ...................... 101/415.1 |

Primary Examiner—William A. Cuchlinski, Jr.
Assistant Examiner—C. W. Fulton
Attorney, Agent, or Firm—Warren W. Kurz

[57] ABSTRACT

A sheet to be clamped includes registration holes at its edges. The leading and trailing ends of the sheet are superimposed, then positioned and clamped with respect to a cylinder by means of a clamping bar. The sheet is tensioned by use of an adjustable tensioner rod. Vernier-type scales on the sheet and cylinder aid in measuring and setting the desired tension. A longitudinal edge of the sheet is located by pins suitably located on the cylinder. In alternative embodiments, the clamping bar and tensioner rod are combined in a unit, or the clamping bar is formed in-split sections to receive the sheet therebetween.

21 Claims, 8 Drawing Sheets

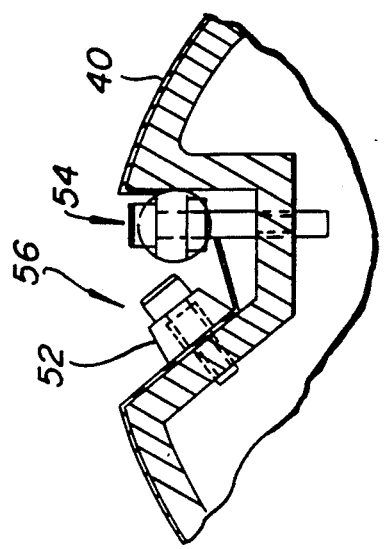
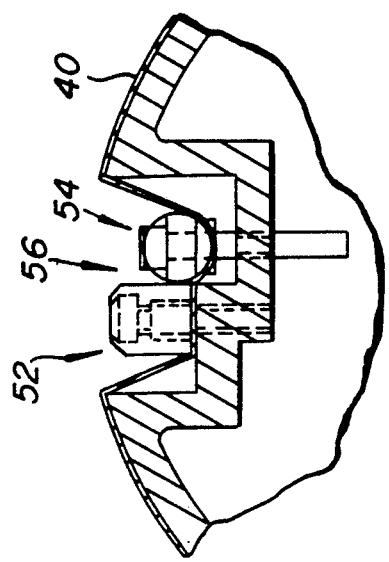
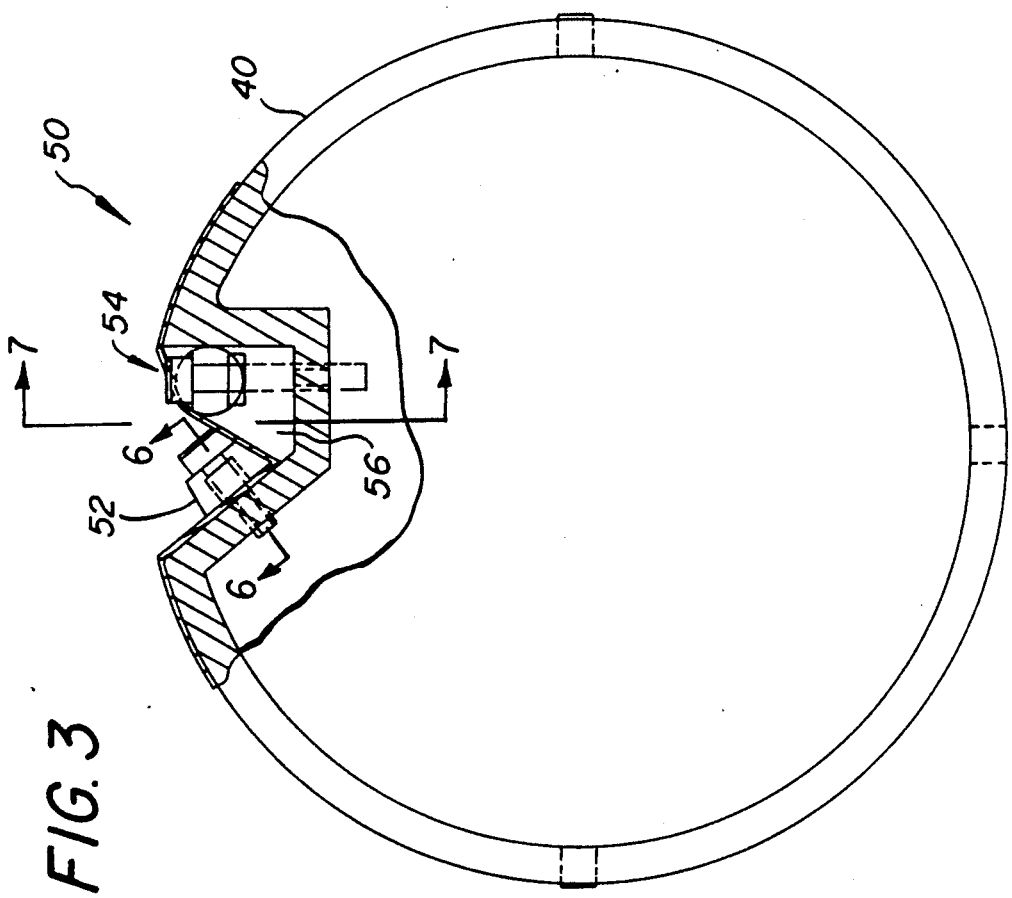

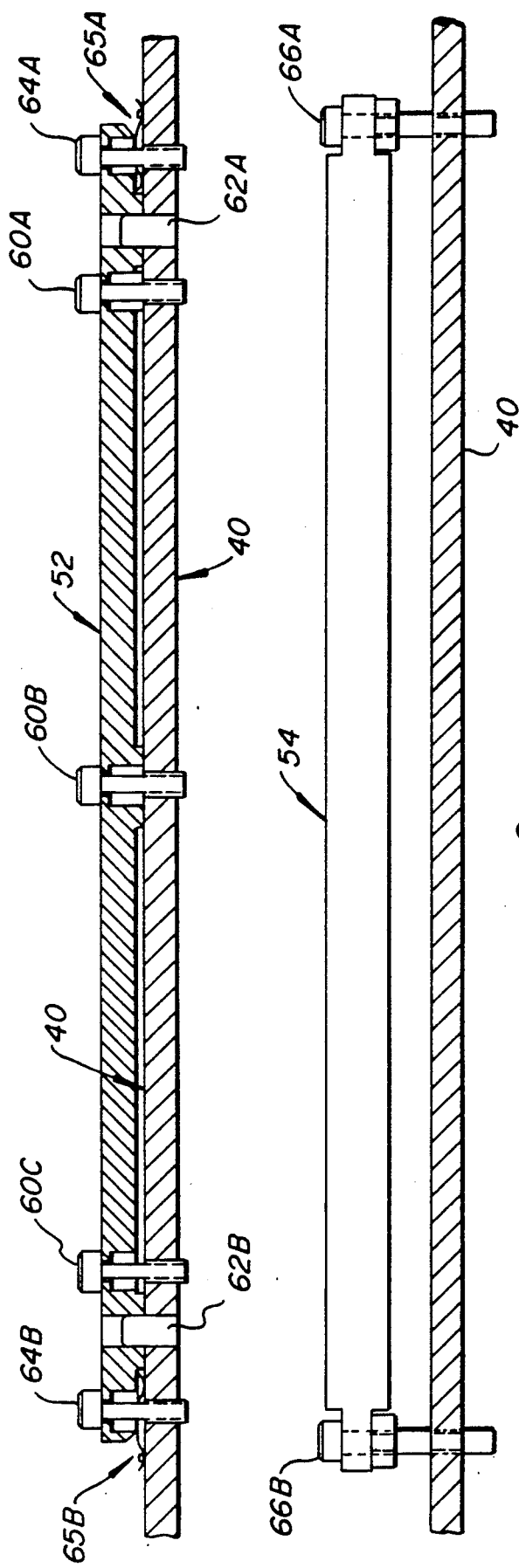
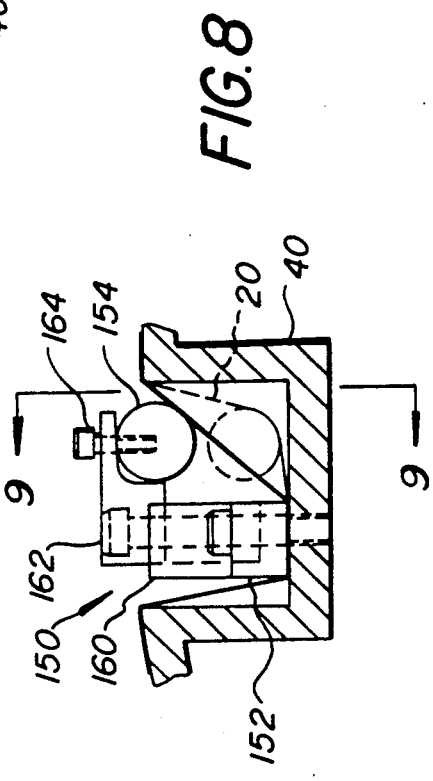

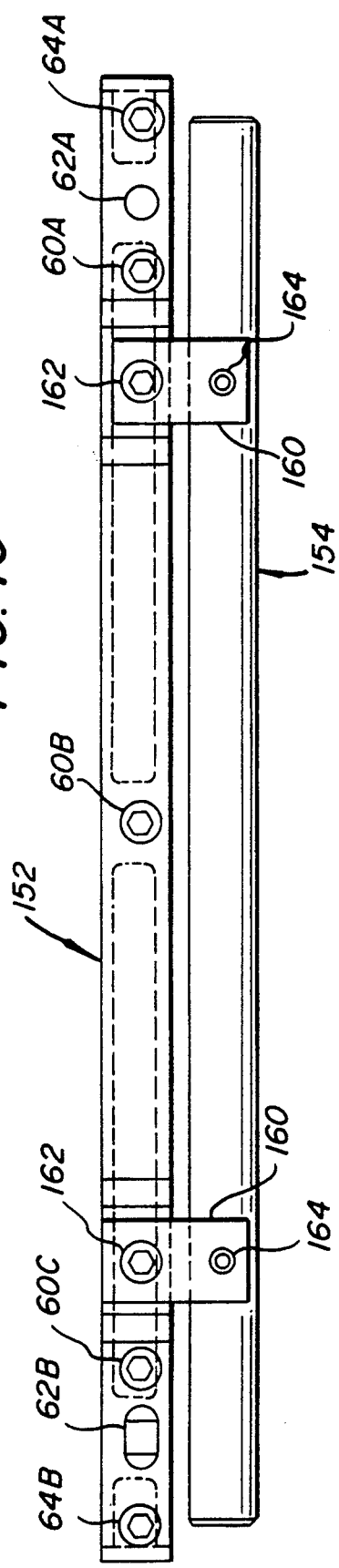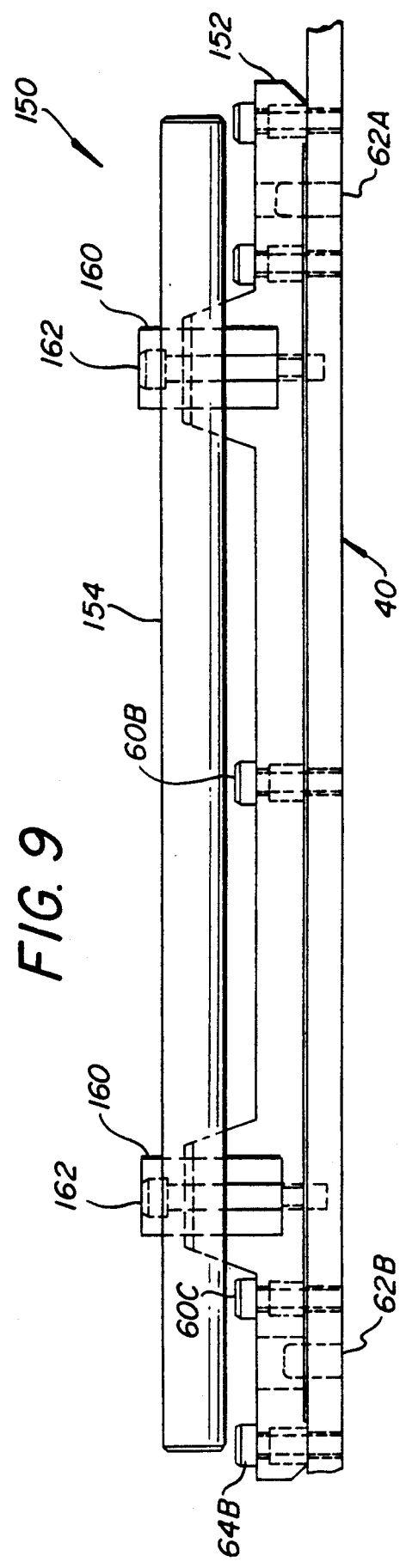

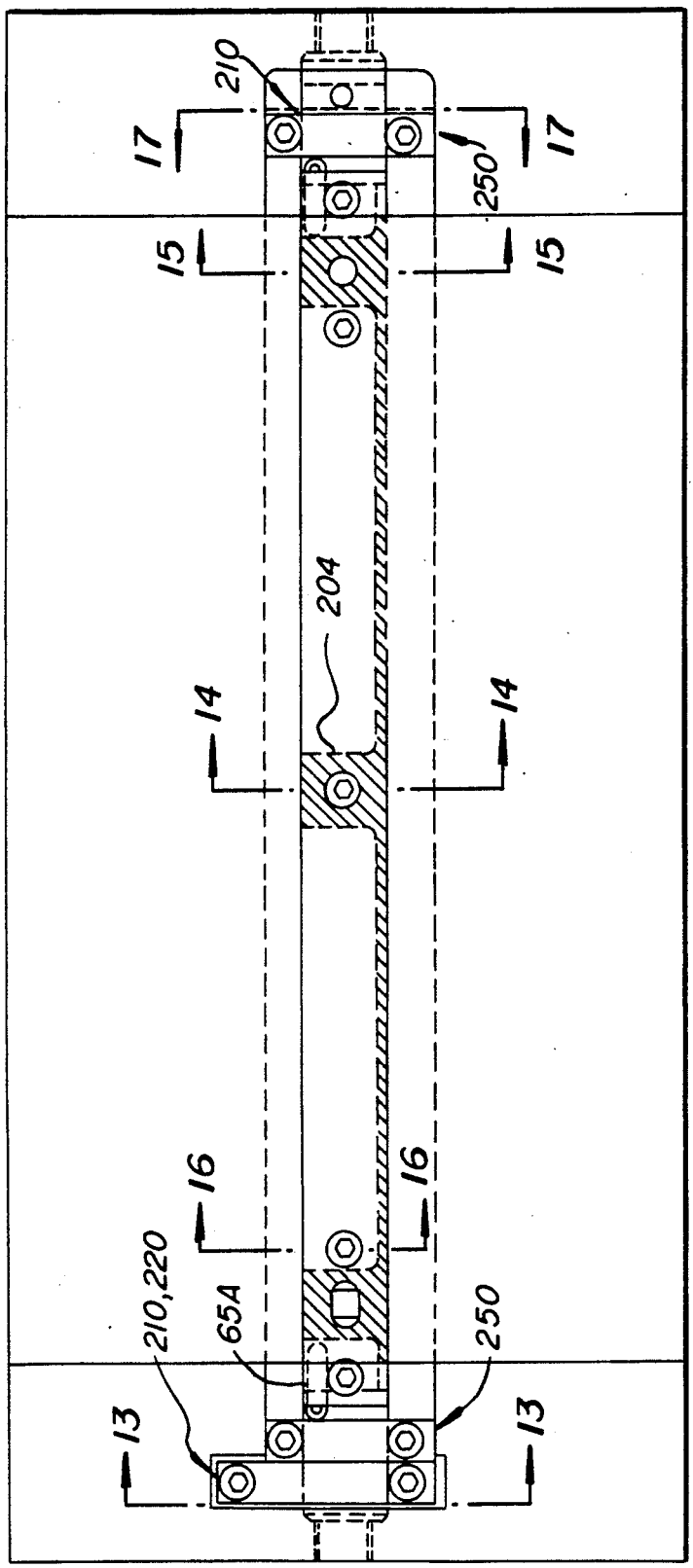
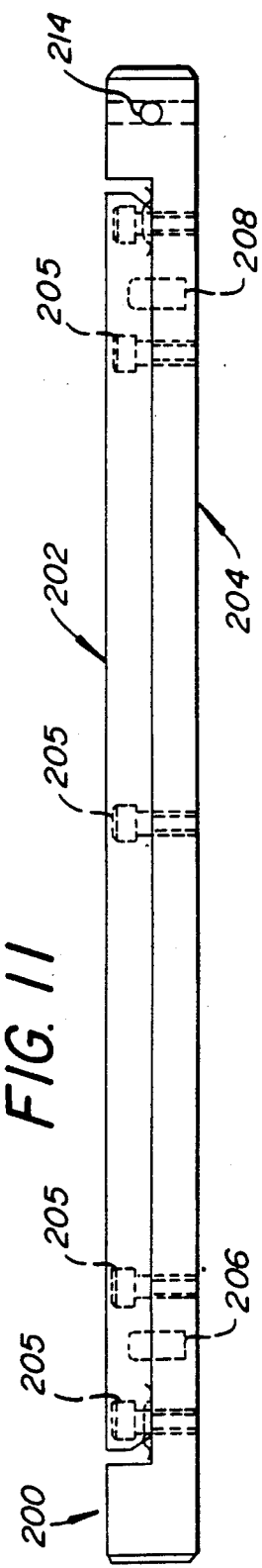
FIG. 12
FIG. 11

SHEET POSITIONING, CLAMPING, AND TENSIONING MEANS

BACKGROUND OF THE INVENTION

1. Field of the Invention

This invention relates generally to means for clamping sheet materials, and in particular to a sheet positioning, clamping, and tensioning means for use with a xeroprinting master sheet.

2. Description of the Prior Art

An image-bearing member used to print many copies of a subject, document, or page is generally known as a master plate or sheet, or simply a "master". There are various types of masters known for use in printing or duplicating machines. A xeroprinting master is mounted on a master cylinder in a xeroprinting engine so as to be rotated past a series of process subassemblies, or stations. Ultimately a transferable image is created and transferred to a receiver to produce a print or reproduction. For simplicity, the term master as used herein refers to flexible sheets and includes printing plates and other master image-bearing substrates known in the industry.

In the production of a composite image, the transferable images generated from several masters are aligned for accurate superimposed registration during the creation of the composite. A multicolor composite print will suffer from undesirable color shift and fringing if the color separation masters are not registered, or if such registration is not accurately maintained. Even in the somewhat simpler task of providing acent color images, wherein as few as two masters are used, image registration is nonetheless critical to an acceptable composite print.

Various clamping or positioning devices are known in the art for securing both unpunched and pre-punched masters in a registered position. Those that hold unpunched masters typically rely on a gripping plate or similar mechanism to frictionally retain the master in position. Such devices are undesirable for applications which require precise registration because the master is liable to slip. These devices may use sharp edges, teeth, or prongs which puncture, tear, crease, or otherwise undesirably damage the master. Furthermore, such prior art devices typically provide accurate registration only after the master is positioned, and repositioned, by trial and error. Such repeated handling of the master is tedious and tends to deform or otherwise damage the master.

Pre-punched masters are conventionally held by two or more clamps. Pins on each clamp engage corresponding pre-punched holes. One clamp holds the leading edge of the master, and a second clamp holds the trailing edge. However, such clamps and other similar means which locate the two ends of the master at two separate areas on the master cylinder have been found to skew the master. That is, the leading and trailing ends of the master are clamped by separate devices which are not registered to each other. In general, such clamps are also bulky, complex to use, and expensive to construct.

A master is typically placed under tension to ensure a smooth and secure fit to the supporting device, which is typically a cylinder. However, prior art tensioning devices have been found to uncontrollably deform the master.

In particular, film masters formed of a polymer base, such as ESTAR ™ film base produced by Eastman Kodak Company, are susceptible to elongation due to elastic and plastic deformation components. Elastic deformation occurs as the master is put under tension. After the tension is established, elastic deformation subsides and the material will plastic flow or "creep" as a function of time. Therefore, the tension will decrease. Some of the creep does not revert to zero when the tension is removed (i.e., the master is permanently deformed.) Unless the aforementioned effects of master deformation are accommodated, accurate registration of the master is difficult if not impossible to achieve.

A further problem arises in the prior art because the strain of the master material is not made uniform over the length of the master. A non-uniformity, or rippling, of the master at its longitudinal edges is experienced, and accurate registration of the master is frustrated.

The invention, and its objects and advantages, will become more apparent in the detailed description of the preferred embodiments presented below.

SUMMARY OF THE INVENTION

It is an object of the invention to provide means for accurate sheet positioning, clamping, and tensioning which offers improved registration of a sheet to a sheet-carrying cylinder.

These and other objects are met by means for positioning, clamping, and tensioning a sheet having first and second opposing ends and sheet-locating indicia. Locating means, cooperative with the indicia when said first and second ends of the received sheet are superimposed, locates the first and second ends in a predetermined configuration. Means for clamping the superimposed and located first and second opposing ends to a cylinder, and means for adjustably tensioning the clamped sheet, are also provided.

In another embodiment of the invention, the aforementioned clamping means further comprises a clamping bar having first and second conjoinable sections adapted for clamping the superimposed ends of the received sheet therebetween, and the aforementioned tensioning means further comprises means for adjustably moving the conjoined first and second separable sections with respect to the received sheet to effect tensioning of the sheet.

In yet another embodiment of the invention, means for receiving, positioning, clamping, and tensioning a sheet onto a cylinder are provided. The sheet has first and second opposing ends, each having plural end-locating apertures, and at least one longitudinal edge having plural edge-locating apertures. First pin means, cooperative with the end-locating apertures when the first and second ends of the received sheet are superposed, are provided for aligning an edge of selected ones of the end-locating apertures with an edge of selected other ones of the end-locating apertures. Second pin means, cooperative with the edge-locating apertures, are provided for locating the longitudinal edge in a predetermined configuration. Also included are means for clamping the superposed and located first and second opposing ends to the cylinder, means for adjustably tensioning the clamped sheet, and means for measuring the tension of the clamped sheet.

BRIEF DESCRIPTION OF THE DRAWINGS

In the detailed description of the preferred embodiments of the invention presented below, reference is made to the accompanying drawings, in which:

FIGS. 3-5 are side sectional views of an improved master sheet positioning, clamping, and tensioning means for use with the master of FIG. 1;

FIGS. 6 and 7 are side sectional and side elevational views, respectively, of a portion of the means in FIG. 3;

FIG. 8 is a side cross-sectional view of an alternative embodiment of the sheet positioning, clamping, and tensioning means of FIG. 3;

FIGS. 9 and 10 are side elevational and plan views, respectively, of the means of FIG. 8;

FIGS. 11 and 12 are partial side sectional and plan sectional views of another alternative embodiment of the means of FIG. 3.

BEST MODE OF CARRYING OUT THE INVENTION

The preferred embodiments of the invention are intended for use as a master sheet positioning, clamping, and tensioning means in an electrostatographic master making appartus. The invention, however, is not limited to use with a master sheet. The positioning, clamping, and tensioning of other sheet materials may also benefit from the practice of the invention.

Because electrostatographic reproduction apparatus are well known, the present description will be directed in particular to elements forming part of, or cooperating more directly with, the invention. Apparatus not specifically shown or described herein are selectable from those known in the prior art.

Figure 1:
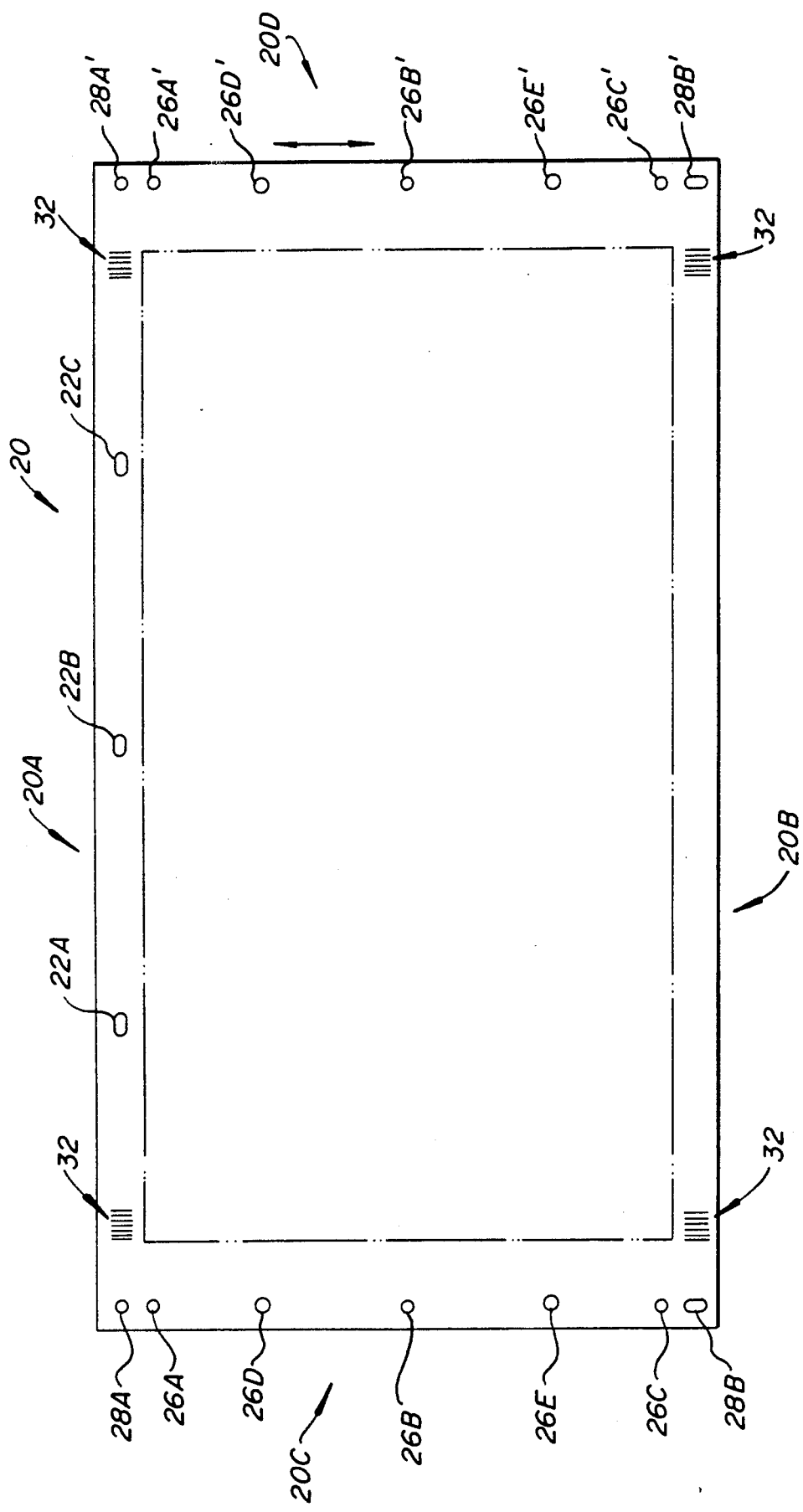
FIG. 1 is a plan view of a master useable in the practice of the invention.
Figure 2:
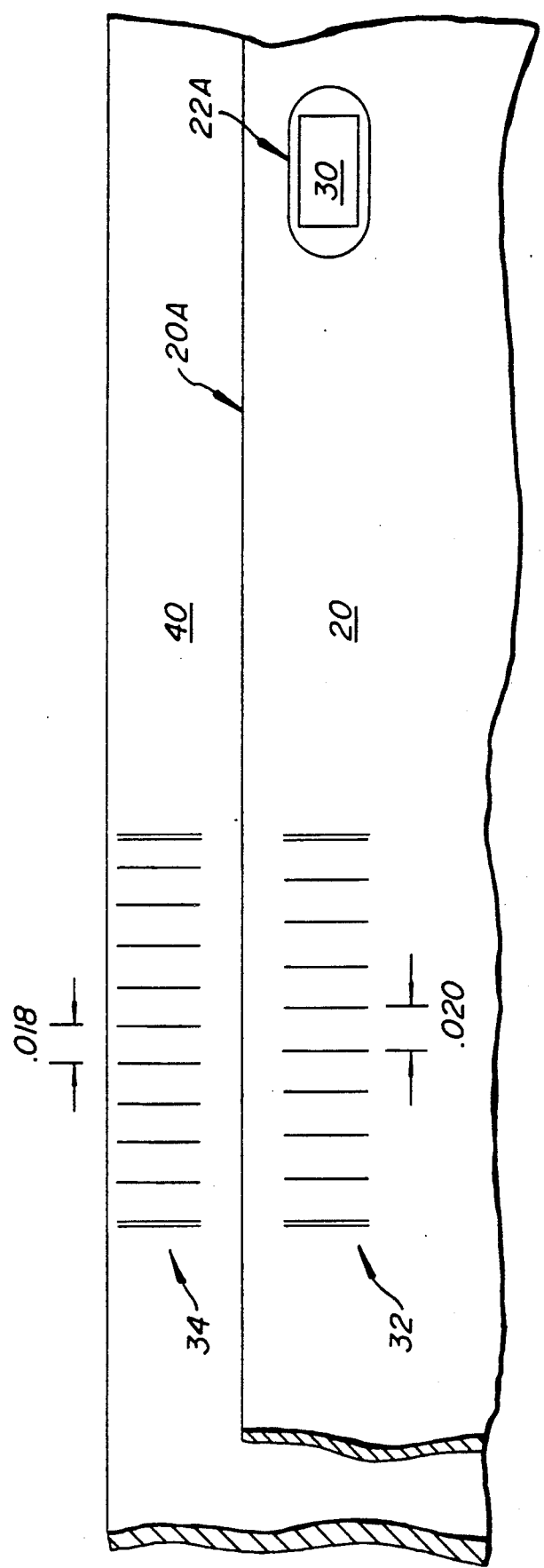
FIG. 2 is a plan view of vernier adjustment scales useable to adjust the tension of the master of FIG. 1.

According to FIGS. 1 and 2, a master 20 is preferably prepared from a sheet section of film base such as ESTAR TM film base manufactured by Eastman Kodak Company. Aluminum sheet stock may also be used. In order to position the longitudinal edges 20A and 20B of the master 20 accurately and without skew, at least one, but preferably three or more elongated holes 22A, 22B, 22C are provided at longitudinal edge 20A. These holes are aligned in the in-track direction. Preferably, the leading and trailing edges 20C and 20D of the master 20 are reinforced with another layer of master material so that the holes are not distorted in the process of positioning and clamping of the master.

A set of round holes 26A, 26B, 26C, and 28A and elongated hole 28B are provided at the leading edge 20C. A corresponding set of round hole 26A', 26B', 26C', and 28A' and elongated hole 28B' are provided at the trailing edge 20D. Thus, when the two edges 20C and 20D are overlaid, the holes 26A, 26B, and 26C will be superimposed upon corresponding holes 26A', 26B', and 26C'. Holes 28A and 28B will also superimpose holes 28A' and 28B'.

The master 20 may therefore be wrapped about a carrier such as a cylinder 40 as shown in FIGS. 2 and 3. The holes 22A, 22B, and 22C at the longitudinal edge 20A will receive pins 30 which project from the cylinder 40 so as to locate, or register, the longitudinal edge 20A to the cylinder 40. The other longitudinal edge 20B is thereby registered also.

A vernier pattern of lines 32 and 34 are provided on the master 20 and cylinder 40, respectively. Observation of the lines during tensioning allows one to measure the degree of tension induced in the master. The line patterns 32 on each side of the master 20 allow for inspection and adjustment of the tension at each intrack edge 20A and 20B. Alternatively, the line pattern 34 may be located such that it is viewed through the master 20 if the master is composed of a transparent material.

As shown in FIGS. 3 through 5, the aforementioned superimposed holes at the leading and trailing edges 20C and 20D are aligned with the cylinder 40 by use of a first embodiment of a sheet positioning, clamping and tensioning means 50 according to the present invention. The first embodiment 50 includes a clamp bar 52 and a tensioner rod 54 which together are secured in a recess 56 in the cylinder 40. FIGS. 4 and 5 illustrate alternate configurations of the clamping bar 52 and tensioner rod 54 in the recess 56. It is also contemplated that a larger recess 56 may be used to accommodate a second tensioner rod (not shown) on the other side of the clamping bar 52.

Holes 28A and 28A', and 28B and 28B', fit tightly over respective pins 62A and 62B. Spring clips 65A and 65B on each side of the clamping bar 52 function as a master retainer while the master is positioned. The clamping bar 52 is then precisely aligned with the superimposed ends 20C and 20D by a friction fit with the upper ends of pins 62A and 62B. Round holes 26A and 26A', 26B and 26B', and 26C and 26C' receive threaded fasteners 60A, 60B, and 60C, respectively. With the master 20 and the clamping bar 52 thereby precisely located on the cylinder 40, the master 20 is then clamped to the cylinder 40 by rotation of threaded fasteners 60A, 60B and 60C and additional threaded fasteners 64A and 64B into respective threaded bores in the cylinder 40.

As illustrated in FIG. 7, the tensioner bar 54 is mounted to the cylinder 40 by use of adjustable screw thread tensioners 66A and 66B. With reference again to FIGS. 3 through 5, the depth of the tensioners 66A, 66B in the cylinder 40 is selected so as to position the tensioner bar 54 against the clamped master 20. For example, in the arrangement shown in FIGS. 4 and 5, as the tensioners 66A and 66B are threaded into the cylinder 40, the master 20 is drawn into the recess 56 and thereby tightens into conformity with the cylinder 40. Preferably, one adjusts the screw thread tensioners 66A and 66B while observing the vernier-type scales 32 and 34 until the desired tension is achieved. Further tensioning, to compensate for master creep, may also be accomplished by additional adjustment of tensioners 66A and 66B.

To reduce the number of loose parts, it is preferred that tensioners 66A and 66B are captive in the tensioner bar 54. Threaded fasteners 60A, 60B, 60C, 64A, and 64B are also captive in clamping bar 52.

FIGS. 8 through 10 illustrate a second embodiment 150 of the positioning, clamping, and tensioning means according to the invention. The alternative embodiment 150 is similar to the first embodiment 50 described above with the exception that the clamping bar 152 and the tensioner rod 154 are joined by an angle support 160. Screws 162 pass through the support 160 and the clamping bar 152 and through holes 26D, 26E, 26D', and 26E' (FIG. 1) into the cylinder 40. Screws 164 join the tensioning bar 154 to the support 160. The clamping bar 152 and tensioning bar 154 are thereby configured as a unit. The tightening of screws 162 causes the tensioning bar 154 to tension the master 20.

Alternatively, and as illustrated in FIGS. 11 and 12, the master 20 may be positioned, clamped and tensioned by use of a rotatable split rod clamp 200 which includes upper 202 and lower 204 sections. The shaded area in FIG. 12 shows the clamp contact area for a master with both ends oriented the same in the clamp. The split rod clamp 200 may be opened and the leading and trailing edges 20C and 20D may be placed over pins 206 and 208. The upper half 202 of the split rod 200 is positioned over the pins 206 and 208; then the fasteners 205 are tightened to clamp the master 20.

Figure 13A:
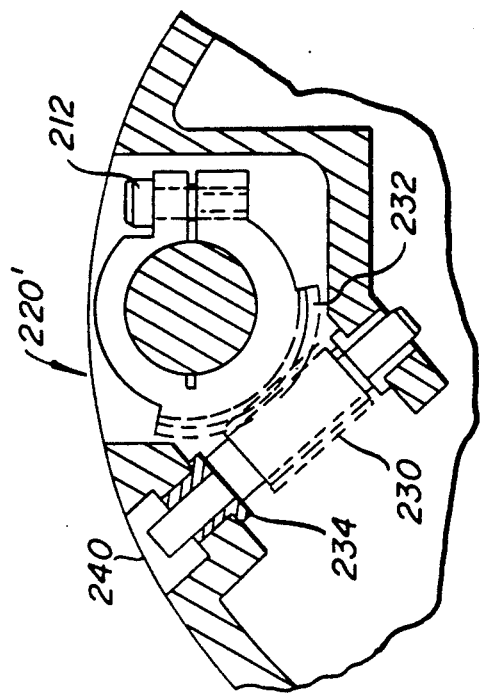
FIGS. 13 through 17 are side sectional views of the means of FIG. 12.
Figure 13B:
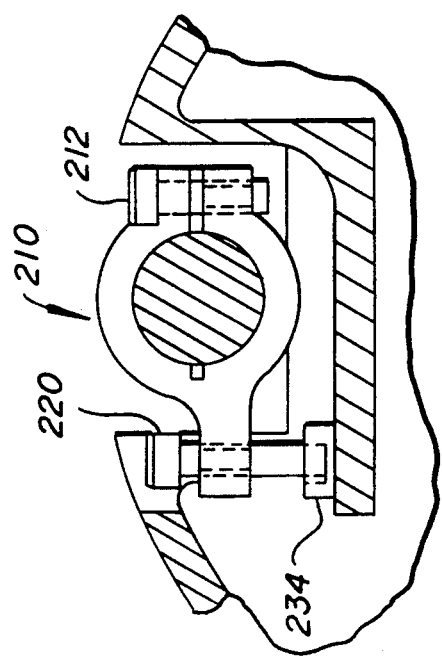
Figure 13C:
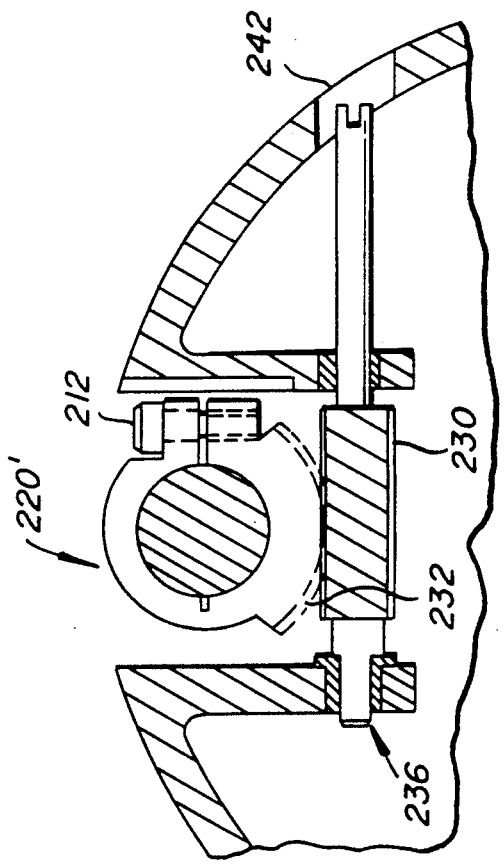

The master 20 can then be tensioned by use of screw thread means 210 (shown in FIG. 13A) or worm gear means 220 or 220' (shown in FIGS. 13B and 13C). If the tensioning required is of considerable angle, the illustrated embodiment may include a pinch-boss clamp 212 to speed up the tensioning process. The pinch-boss clamp 212 must first be unclamped and then the master 20 is pretensioned by manually rotating the split rod 200 with the leverage provided by a slender tool such as an allen wrench (not shown) inserted in a hole 214 at the end of the rod.

Final tensioning to obtain registration is then performed with screw thread adjustment of a threaded adjuster 220 or with a worm adjuster 230 and worm gear 232. The latter combination is adjusted by rotation the worm adjuster 230 by use of an appropriate tool (not shown) inserted in an access bore 240 or 242.

The master tension may be measured during a final tensioning adjustment by observation of the vernier scales 32 and 34 by use of a magnifier such as an eye loupe. If, for example, a pattern of ten equally-spaced lines 0.018 inch apart is located on the cylinder 40 and a pattern of nine equally-spaced lines 0.020 inch apart is adjacent the master 20, a positional accuracy of 0.002 of an inch can be realized by vernier adjustment of the master tension. Preferably, bearings 234 and 236 are included to make such an adjustment smooth and accurate.

Figure 14A:
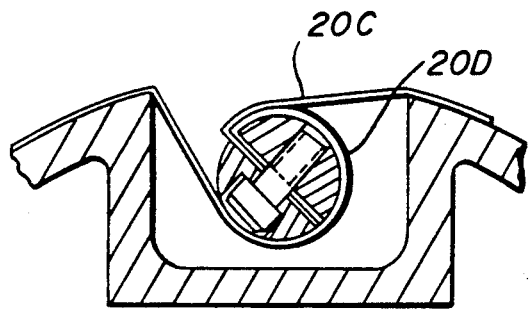
Figure 14B:
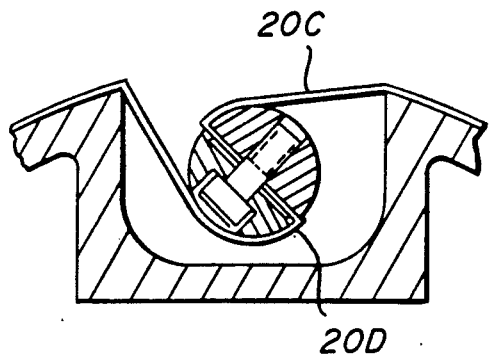
Figure 15A:
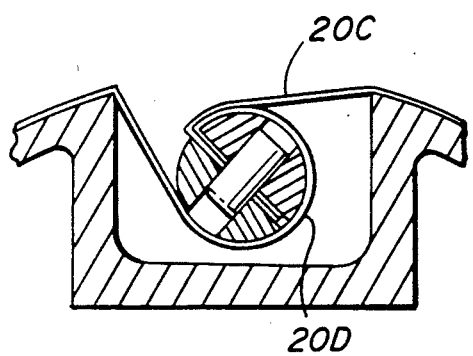
Figure 15B:
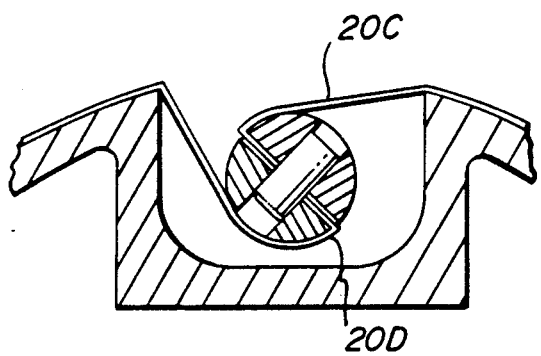
Figure 16:
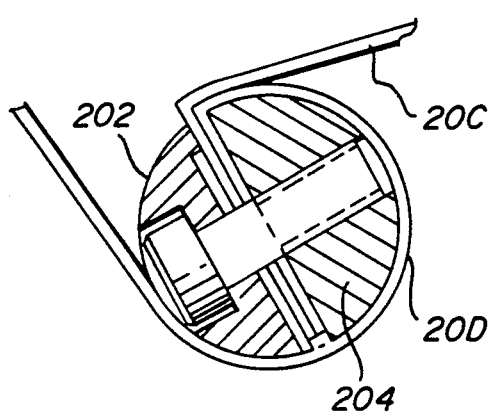

The film ends 20C and 20D are oriented in the same direction within the clamp. FIGS. 14A and 15A show the master 20 wound around the split rod clamp 200 with both ends 20C and 20D oriented in the same direction within the clamp. With both ends oriented similarly, the master 20 may be longer and therefore easier to handle when mounting it in the split rod clamp 200. A disadvantage is that more of the master 20 must be wrapped on the split rod clamp 200, a motion which increases the angle through which the split rod clamp must travel to tension the master. A shorter master 20 may be used in the embodiment shown in FIGS. 14B and 15B, wherein the film ends 20C and 20D are oriented in opposite directions within the clamp. Consequently, such an embodiment has the advantage that the requisite rotation of the screw thread adjustment means 210 or the worm gear adjustment means 220 or 220' is reduced.

Figure 17:
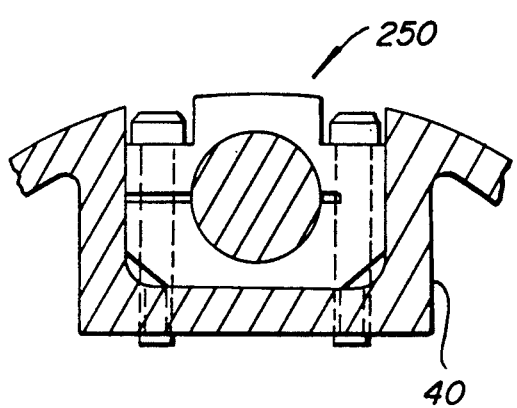

The tensioning arrangements illustrated in FIGS. 11 through 15 will evenly tension the master 20 at both ends. A split rod support block 250 is illustrated in FIG. 17. Additionally, the embodiment of a clamping bar 52 illustrated in FIG. 5 may be used at one end of the master 20 and the split rod clamp 200 of FIG. 11 may be used at the other end of the master 20. Such an arrangement will tension and therefore strain the material more at the tensioner rod end.

In the practice of the invention, only a very simple tool, such as an allen wrench, is required to position, clamp, and tension the master. The master may therefore be installed without guesswork and with accurate registration on the first try. Any manipulation of the master is minimized.

Skewing of the master is greatly reduced, due to at least three factors. The master 20 is clamped at both the leading edge 20C and trailing edge 20D by a single device. The master is more easily and uniformly tensioned. The longitudinal edge 20A and 20B is located by the pins 30 on the cylinder.

The master 20 is thus registered more accurately than is accomplishable by prior art devices. Furthermore, the accuracy of registration that is achieved is more easily maintained, especially when the master is composed of a film base.

Conventionally, a film base master is very difficult to clamp, tension, and register due to its inherent lack of rigidity and its proclivity to creep due to the applied tension and to the effects of temperature and humidity variations. However, the use of the vernier scales 32 and 34 in conjunction with the adjustable tensioners described above allows one to set and maintain the registration of a film base master in situ, or after the master has been moved from cylinder to cylinder. By observation of the vernier scales, the amount of tension applied may be quantified, and therefore none but the requisite tension need be used. Plastic deformation of the master is therefore avoided. One may also achieve a selected amount of elastic deformation in each of several masters installed in one reproduction apparatus. Master-to-master registration is thereby improved.

It is contemplated that any of the above positioning, clamping and tensioning embodiments may be used as described, or modifications of one embodiment may be incorporated in another.

Thus, the invention has been described in detail with particular reference to preferred embodiments thereof, but it will be understood that variations and modifications can be effected within the spirit and scope of the invention.

What is claimed is:

1. Apparatus for receiving, positioning, clamping, and tensioning a sheet onto a cylinder, said sheet having first and second opposing ends each of which having sheet-locating indicia, comprising:
   locating means, cooperative with said indicia when said first and second ends of the received sheet are superimposed, for locating said first and second ends in a predetermined configuration;
   means for clamping said superimposed and located first and second opposing ends to the cylinder;
   means for adjustably tensioning the clamped sheet; and
   means for detecting the tension in the clamped sheet, said detecting means comprising: means defining a vernier scale on said cylinder, said vernier scale being located adjacent a lateral edge of a received sheet and cooperating with means defining a similar vernier scale located on said sheet along such lateral edge to provide a visual indication of sheet tension.

2. The apparatus of claim 1, wherein the sheet-locating indicia comprise plural spaced apertures located symmetrically about an axis orthogonal to the first and second opposing ends and the locating means includes plural spaced pins for engaging the apertures of the received sheet.

3. The apparatus of claim 2, wherein the pins are located on the cylinder.

4. The apparatus of claim 2, wherein the pins are located on the clamping means.

5. The apparatus of claim 1, wherein the clamping means further comprises:
   a clamping bar; and
   fastening means for attaching the clamping bar to the cylinder.

6. The apparatus of claim 5, wherein the clamping bar comprises first and second conjoinable sections adapted for clamping the superimposed ends of the received sheet therebetween.

7. The apparatus of claim 6, wherein the tensioning means further comprises means for adjustably moving the conjoined first and second separable sections with respect to the received sheet to effect tensioning of the sheet.

8. The apparatus of claim 7, wherein the means for moving the conjoined separable sections comprises a screw thread tensioner.

9. The apparatus of claim 7, wherein the means for moving the conjoined separable sections comprises a worm gear tensioner.

10. The apparatus of claim 1, wherein the tensioning means further comprises:
    a tensioner rod; and
    adjustable fasteners for attaching said rod to the cylinder at a selectable position with respect to the sheet for tensioning the sheet.

11. Apparatus for receiving, positioning, clamping, and tensioning a sheet onto a cylinder, said sheet having first and second opposing ends each of which having plural end-locating apertures therein, and said sheet having a longitudinal edge having an edge-locating aperture therein, comprising:
    first locating means, cooperative with said end-locating apertures when said first and second ends of the received sheet are superimposed, for locating said first and second ends in a predetermined configuration;
    second locating means, cooperative with said edge-locating apertures for locating said longitudinal edge in a predetermined configuration;
    means for clamping said superimposed and located first and second opposing ends to the cylinder;
    means for adjustably tensioning the clamped sheet; and
    means for detecting the tension in the clamped sheet, said detecting means comprising: means defining a vernier scale on said cylinder, said vernier scale being located adjacent a lateral edge of a received sheet and cooperating with means defining a similar vernier scale located on said sheet to provide a visual indication of sheet tension.

12. The apparatus of claim 11, wherein the first locating means includes means for aligning the edges of two of said end-locating apertures in said first end with the edges of two of said end-locating apertures in said second end.

13. The apparatus of claim 11, wherein the clamping means further comprises:
    a clamping bar; and
    fastening means for attaching the clamping bar to the cylinder.

14. The apparatus of claim 13, wherein the alignment means further comprises spaced plural pins located on the clamping bar for engaging respective end-locating apertures.

15. The apparatus of claim 13, wherein the alignment means includes spaced plural pins located on the cylinder for engaging respective end-locating apertures.

16. The apparatus of claim 13, wherein the clamping bar comprises first and second conjoinable sections adapted for clamping the superimposed ends of the received sheet therebetween.

17. The apparatus of claim 16, wherein the tensioning means further comprises means for adjustably moving the conjoined first and second separable sections with respect to the received sheet to effect tensioning of the sheet.

18. The apparatus of claim 17, wherein the means for moving the conjoined sections comprises a screw thread tensioner.

19. The apparatus of claim 17 wherein the means for moving the conjoined separable sections comprises a worm gear tensioner.

20. The apparatus of claim 11, wherein the second locating means includes a pin located on the cylinder for engaging a respective edge-locating aperture.

21. The apparatus of claim 11, wherein the tensioning means further comprises:
    a tensioner rod; and
    adjustable fasteners for attaching said rod to the cylinder at a selectable position with respect to the sheet for tensioning the sheet.

* * * * *